United States Patent
Birmiwal et al.

(10) Patent No.: US 7,853,420 B2
(45) Date of Patent: Dec. 14, 2010

(54) PERFORMING TEMPORAL CHECKING

(75) Inventors: Parag Birmiwal, Austin, TX (US);
Sundeep Chadha, Austin, TX (US);
Tilman Gloekler, Gaertringen (DE);
Johannes Koesters, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 421 days.

(21) Appl. No.: 12/102,510

(22) Filed: Apr. 14, 2008

(65) Prior Publication Data

US 2008/0195339 A1  Aug. 14, 2008

Related U.S. Application Data

(63) Continuation of application No. 11/297,308, filed on Dec. 8, 2005, now Pat. No. 7,464,354.

(51) Int. Cl.
*G06F 17/50* (2006.01)
(52) U.S. Cl. .............................. 702/79; 716/5
(58) Field of Classification Search ................. 702/79, 702/76, 77, 182–185; 716/5, 6, 4
See application file for complete search history.

(56) References Cited

U.S. PATENT DOCUMENTS 5,953,519 A    9/1999  Fura
6,324,496 B1   11/2001 Alur et al.
6,499,132 B1   12/2002 Morley et al.
6,985,840 B1 *  1/2006 Hsu et al. ...................... 703/7
7,464,354 B2   12/2008 Birmiwal et al.
2004/0123254 A1 6/2004 Geist et al.

OTHER PUBLICATIONS

"Speciman Elite—Testbench Automation," http://versity.com/products/specman.html.
H. W. Anderson et al, "Configurable system simulation model build comprising packaging design data," IBM J. Res. & Dev., vol. 48, No. 3/4, May/Jul. 2004.
Office Action dated Dec. 13, 2007.
Office Action dated Mar. 23, 2009.

* cited by examiner

*Primary Examiner*—Edward Raymond
(74) *Attorney, Agent, or Firm*—Dillon & Yudell, LLP

(57) ABSTRACT

An apparatus for performing temporal checking is disclosed. A signal logger for performing temporal checking includes a group of edge detection modules and a group of counting modules. During testing, the signal logger is coupled to a device under testing (DUT). Each of the edge detection modules is capable of maintaining edge information after a state transition on a signal within the DUT has been detected. Each of the counting modules is associated with one of the edge detection modules. Each of the countering modules is capable of maintaining a clock cycle count information associated with a detected edge. After the testing has been completed, temporal checking information on a signal within the DUT can be obtained by reconstructing the edge information and the associated clock cycle count information of the signal collected during the test.

6 Claims, 3 Drawing Sheets

PERFORMING TEMPORAL CHECKING

PRIORITY Claim

The present application is a continuation of U.S. patent application Ser. No. 11/297,308 now U.S. Pat. No. 7,464,354, filed Dec. 8, 2005, and entitled "Method and Apparatus for Performing Temporal Checking," which is incorporated herein by reference.

BACKGROUND OF THE INVENTION

1. Technical Field

The present invention relates to circuit design verification in general, and, in particular, to computer software for analyzing the functional correctness of a circuit design.

Still more particularly, the present invention relates to a method and apparatus for performing temporal checking.

2. Description of Related Art

Design verification is typically utilized to determine whether a device exactly implements the requirements defined by the specification of that device. Design verification for a device under testing (DUT) may be performed on an actual device, or, most likely, on a simulation model of the device.

The process of verifying a design through a simulation model of a DUT is aided by the availability of hardware description languages (HDLs) such as Verilog and VHDL. In order to interface with the simulation model of the DUT described in HDLs, a verification engineer typically has to write additional programming code for the purpose of performing design verification on the DUT. The resultant simulated model of the DUT can receive input stimuli in the form of test vectors. The results produced by the simulated model of the DUT are then checked against the expected results for the DUT.

Testing environments can be static or dynamic. A static testing environment drives pre-computed test vectors into the simulation model of a DUT and examines the results after the operation. However, if a static testing environment is used to examine the results that are output from the simulation model of a DUT, then errors in the test are not detected until after the test has been completed. As a result, the internal state of the DUT at the point of error may not be determinable, requiring the simulation to be repeated again in order to determine such internal states. Thus, static testing may require the expenditure of considerable time, especially during long tests.

Dynamic testing environments are more useful and efficient. In a dynamic testing environment, a set of programming instructions is written to generate the test vectors in concurrence with the simulation model of a DUT while potentially being controlled by the state feedback of the simulated model of the DUT. Dynamic testing enables directed random generation to be performed, and is more sensitive to effects uncovered during the test itself on the state of the simulation model of the DUT. Thus, dynamic testing clearly has many advantages for design verification over static testing.

However, both static and dynamic testings can be implemented only with fixed-vector or pre-generation input. A more sophisticated functional verification system enables a test generation to produce the environment, particularly for functional verification in order for various elements to be defined and connected together correctly so that a DUT can perform as specified. An example of such functional verification system is the Specman$^T$ tools developed by Verisity Ltd. in Israel and available through Verisity Design, Inc. in Mountain View, Calif.

For functional verification of state-of-the-art integrated circuit devices, it is essential to use an efficient methodology to check the dynamic behavior of various signals and/or buses. Such kind of functional verification is commonly referred to as temporal checking. Temporal checking can be as simple as checking for a single pulse of a certain minimum or maximum length, or can be as complex as verifying complicated sequences of events in a bus protocol.

The common implementation of temporal checking via a cycle-based HDL simulator is to use a software simulation interface, such as the Specman$^T$ tools, that is able to read the signals of interest in each simulation cycle. During testing, the software simulation interface monitors the testing by interrupting and querying the cycle-based HDL simulator on every clock edge in order to obtain the state and value of the signal(s) of interest. The cycle-based HDL simulator has to be re-started after each querying is done. Because of the cycle-based HDL simulator has to be constantly interrupted and re-started during temporal checking, the simulation speed is significantly reduced. In addition, the ratio of runtime state to interrupted state is relatively low because the cycle-based HDL simulator may only be allowed to run for very short periods of time (as small as one clock cycle) before each interruption. Those drawbacks become a performance bottleneck when verifying a very-large integrated circuit design where many thousand signals need to be checked simultaneously.

Consequently, it would be desirable to provide an improved method for performing temporal checking.

SUMMARY OF THE INVENTION

In accordance with a preferred embodiment of the present invention, a signal logger for performing temporal checking includes a group of edge detection modules and a group of counting modules. During testing, the signal logger is coupled to a device under testing (DUT). Each of the edge detection modules is capable of maintaining edge information after a state transition on a signal within the DUT has been detected. Each of the counting modules is associated with one of the edge detection modules. Each of the countering modules is capable of maintaining a clock cycle count information associated with a detected edge. After the testing has been completed, temporal checking information on a signal within the DUT can be obtained by reconstructing the edge information and the associated clock cycle count information of the signal collected during the test.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
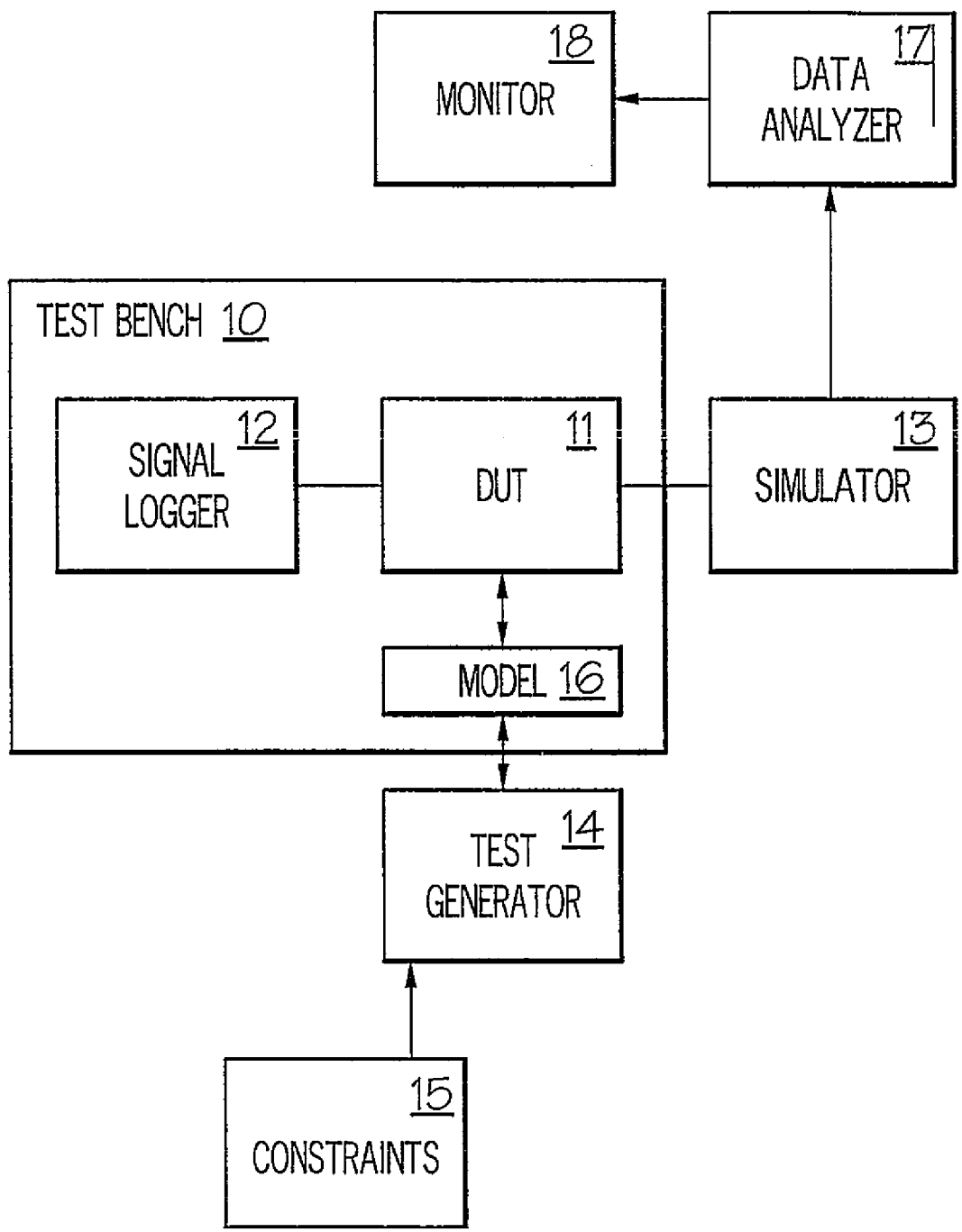
FIG. 1 is a block diagram of a design verification system, in accordance with a preferred embodiment of the present invention.

Referring now to the drawings and in particular to FIG. 1, there is depicted a block diagram of a design verification system, in accordance with a preferred embodiment of the present invention. As shown, a test bench 10 includes a device under testing (DUT) 11, a signal logger 12, and an input/output (I/O) data model 16. DUT 11 is preferably written in a hardware descriptive language (HDL) such as Verilog or VHDL. In addition, a test generator 14 may also be written in HDL. Signal logger 12 detects and logs the behavior of various signals within DUT 11. A simulator 13 interacts with test generator 14 for performing specific test generation procedure. Test generator 14 receives constraints 15 and programs I/O data model 16 to perform testing and verification on DUT 11.

During testing and verification, simulator 13 provides means to access internal node of the DUT by accessing the requested data through an application programming interface (API). Such an API specifies the software function calls required in order to collect the desired data. The collected data is then analyzed by a data analyzer 17. After being analyzed by data analyzer 17, the analyzed data can then be displayed to a user via a monitor 18, preferably through a graphical user interface (GUI).

Figure 2:
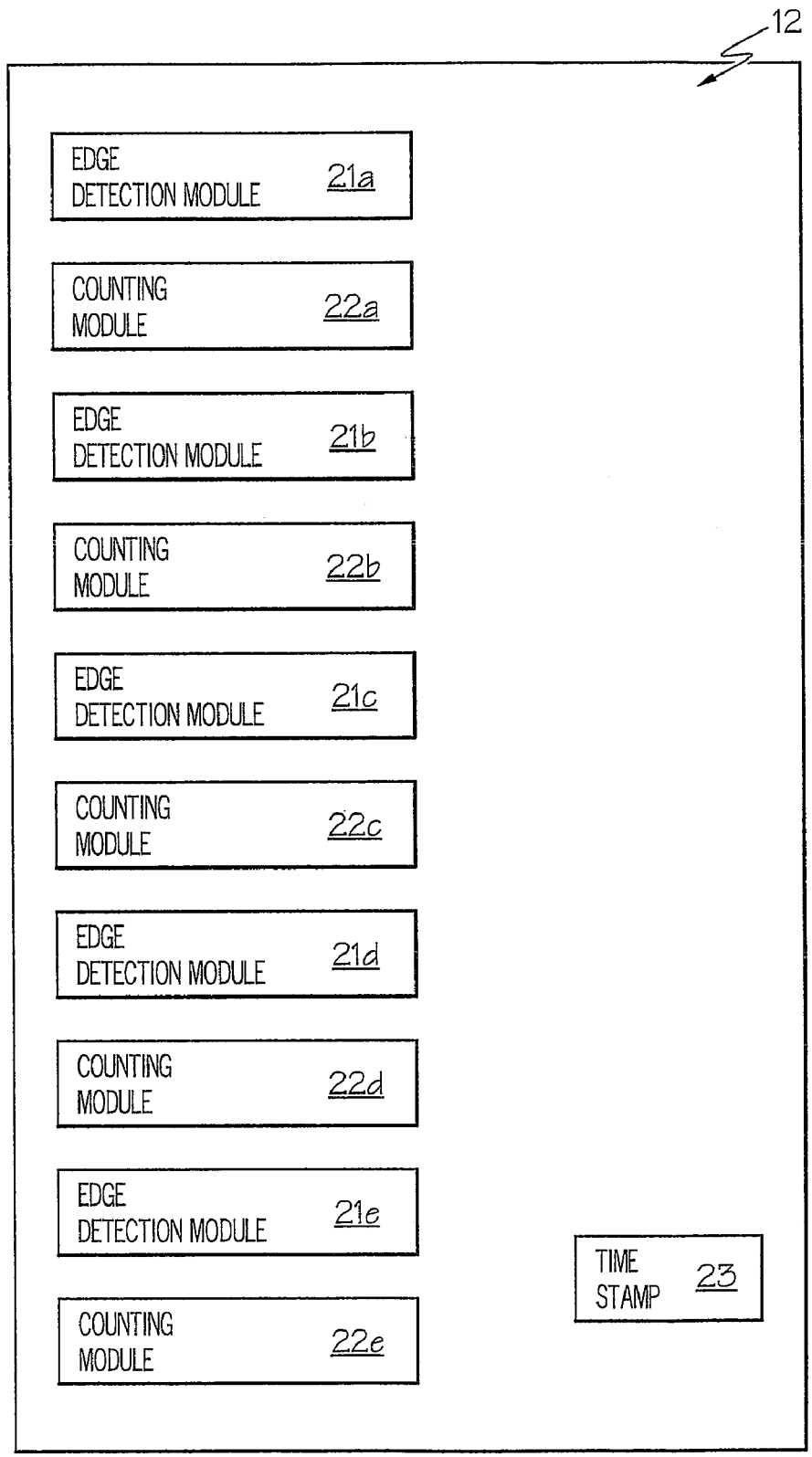
FIG. 2 is a block diagram of a signal logger within the design versification system in FIG. 1, in accordance with a preferred embodiment of the present invention.

With reference now to FIG. 2, there is depicted a block diagram of signal logger 12, in accordance with a preferred embodiment of the present invention. As shown, signal logger 12 includes edge detection modules 21a-21e, counting modules 22a-22e and a time stamp module 23. Each of edge detection modules 21a-21e works in conjunction with an associated one of counting modules 22a-22e.

Signal logger 12 is preferably a hardware device having edge detection modules 21a-21e implemented by flip-flops, counting modules 22a-22e implemented by counters, and time stamp module 23 implemented by a timer. However, signal logger 12 can also be written in HDL such that many signal loggers can be instantiated in the simulation environment with all the signal loggers being connected to a signal that needs to be monitored. Once the connections have been completed and the "model build" process has been run, signal logger 12 can be included in the model of the simulation system to be simulated as hardware elements during the testing and verification.

At the beginning of a test, all counting modules 22a-22e start counting in terms of clock cycles. In conjunction, each of edge detection modules 21a-21e is designated to detect one type of edge transitions, either from a high state to a low state, or from a low state to a high state, which occurs during the testing. Once an edge transition has been detected by one of edge detection modules 21a-21e, its associated one of counting modules 22a-22e stops its count. Time stamp module 23 records the clock count/time stamp each time when an edge transition is detected.

For example, edge detection module 21a is associated with counting module 22a, edge detection module 21b is associated with counting module 22b, edge detection module 21c is associated with counting module 22c, edge detection module 21d is associated with counting module 22d, and edge detection module 21e is associated with counting module 22e. Each of edge detection modules 21a-21c is designated to detect an edge transition from a low state to a high state, and each of edge detection modules 21d-21e is designated to detect an edge transition from a high state to a low state. Before testing begins, edge detection modules 21a-21c are set to a high state, edge detection modules 21d-21e are set to a low state, and counting modules 22a-22e are all set to zero.

Figure 3:
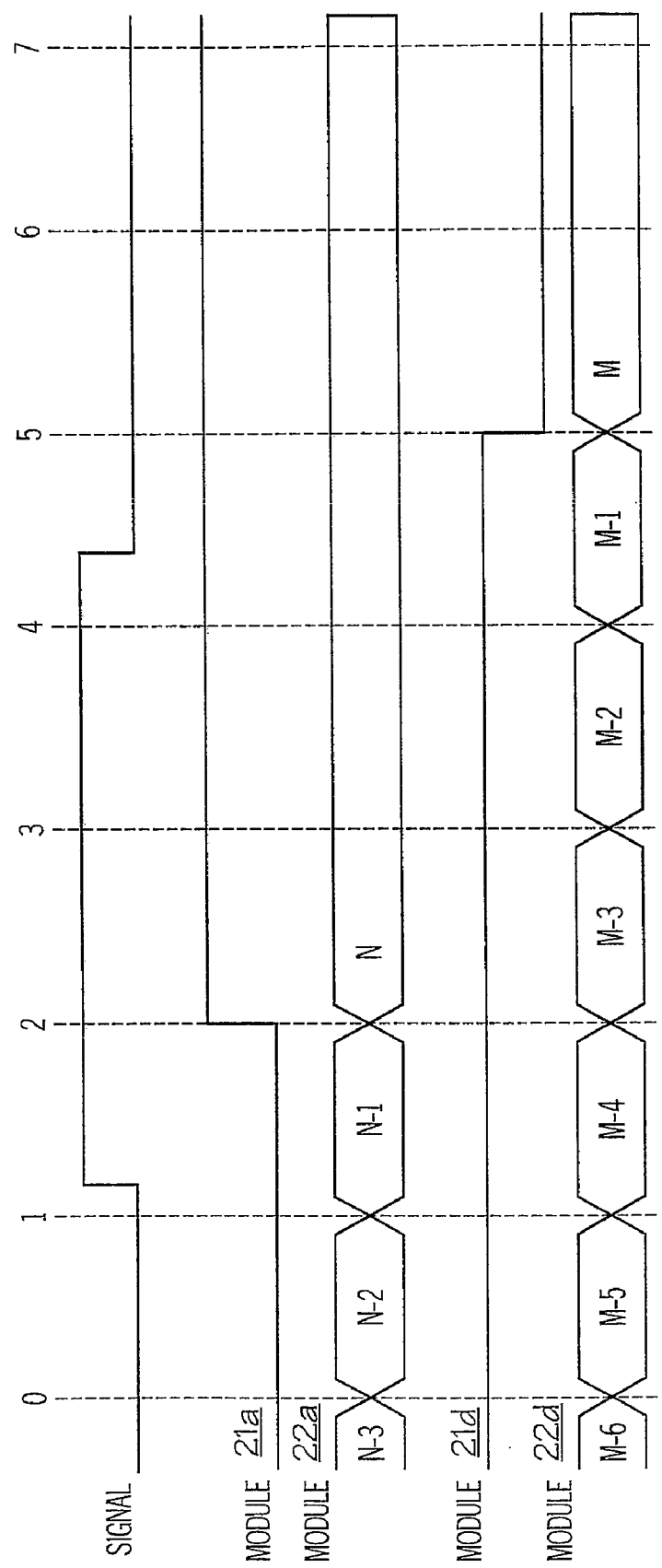
FIG. 3 depicts an example of various waveforms collected by the signal logger from FIG. 2, in accordance with a preferred embodiment of the present invention.

Referring now FIG. 3, there is depicted an example of various waveforms collected by signal logger 20 from FIG. 2, in accordance with a preferred embodiment of the present invention. As shown, a signal of interest SIGNAL within DUT 11 (from FIG. 1) transitions from a low state to a high state between clock cycles 1 and 2, and then transitions from a high state back to a low state between clock cycles 4 and 5. At clock cycle 2, edge detection module 21a, which is designated to detect an edge transition from a low state to a high state, transitions from a low state to a high state, and remains in the high state throughout the entire test. In conjunction, counting module 22a, which is associated with edge detection module 21a, stops its clock cycle count after clock cycle 2 to signify that the above-mentioned edge transition occurred between clock cycles 1 and 2.

Similarly, at clock cycle 5, edge detection module 21d, which is designated to detect an edge transition from a high state to a low state, transitions from a high state to a low state, and stays in the low state for the remaining portion of the test. In conjunction, counting module 22d, which is associated with edge detection module 21d, stops its clock cycle count after clock cycle 5 to signify that the above-mentioned edge transition occurred between clock cycles 4 and 5.

After the test has been completed, a test engineer can write software routines of complex temporal expressions to check the logged signals, such as those shown in FIG. 3. For example, if the first low-to-high transition on SIGNAL is defined as event A, and the first high-to-low transition on SIGNAL is defined as event B, then signal logger 20 logs event A and event B, including time stamps/clock counts. A simple temporal expression can be defined that if event A occurs, event B must occur within 10 cycles after that. Software routine can be used to query signal logger 20 at the end of the test to get the logged information that includes such events and their associated time stamps/clock counts.

As has been described, the present invention provides a signal logger for performing temporal checking. The signal logger is part of the hardware model and can monitor and log the activity on any signal along with time stamp/clock count when the appropriate user defined changes in the state of the signals is detected. After testing, software routines can be used to post process the logged signals, and various temporal and relationship checks can be performed on the logged signals. As a result, runtime improvements in the order of one to two magnitudes on an emulator running a system level model can be achieved.

Compared to the prior art software-only approach, the signal logger of the present invention reduces the runtime and improves the efficiency of a design verification system. This is because the signal logger of the present invention monitors the state of the signals within a DUT without interrupting and querying a simulator. Thus, most of the overhead wasted in interrupting, querying and restarting the simulator can be avoided. Furthermore, since the simulator is allowed to run continuously for a large number of clock cycles without interruption, the performance gains from hardware simulators can be fully achieved. The additional logic that is added to the simulation model in order to implement the signal logger has a negligible effect on simulation runtime, because such logic is completely insignificant compared to the typical logic complexity of a multi-million gate chip model.

It is also important to note that although the present invention has been described in the context of hardware, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or compact discs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. An apparatus for performing temporal checking, said apparatus comprising:
    a first edge detection module for maintaining a first edge transition information after a detection of a signal of interest within a device under testing (DUT) had transitioned from a low state to a high state;
    a first counting module associated with said first edge detection module for maintaining a first clock cycle count information to be associated with said first edge transition information;
    a second edge detection module for maintaining a second edge transition information after a detection of said signal of interest within said DUT had transitioned from said high state back to said low state;
    a second counting module associated with said second edge detection module for maintaining a second clock cycle count information to be associated with said second edge transition information; and
    means for reconstructing said first and second edge transition information and said associated first and second clock cycle count information, respectively, in order to provide temporal checking information for said signal of interest within said DUT.

2. The apparatus of claim 1, wherein said first and second edge detection modules are flip-flops.

3. The apparatus of claim 1, wherein said first and second counting modules are counters.

4. The apparatus of claim 1, wherein said means for reconstructing is a data analyzer.

5. The apparatus of claim 1, wherein said first counting module performs counting until a clock cycle after said signal of interest within DUT had transitioned from said low state to said high state.

6. The apparatus of claim 5, wherein said second counting module performs counting until a clock cycle after said signal of interest within DUT had transitioned from said high state back to said low state.

* * * * *